United States Patent [19]

Armstrong, II

[11] Patent Number: 5,373,202
[45] Date of Patent: Dec. 13, 1994

[54] THREE STATE INPUT CIRCUIT FOR AN INTEGRATED CIRCUIT

[75] Inventor: Gene Lee Armstrong, II, Garland, Tex.

[73] Assignee: Benchmarq Microelectronics, Inc., Carrollton, Tex.

[21] Appl. No.: 976,469

[22] Filed: Nov. 16, 1992

[51] Int. Cl.$^5$ ......................................... H03K 19/0175
[52] U.S. Cl. ......................................... 326/58; 326/62; 327/108
[58] Field of Search ............... 307/451, 443, 475, 473, 307/270; 375/17

[56] References Cited

U.S. PATENT DOCUMENTS

| | | | |
|---|---|---|---|
| 4,620,310 | 10/1986 | Lvovsky | 375/17 |
| 4,814,644 | 3/1989 | Yamakawa | 307/473 |
| 5,262,689 | 11/1993 | Glica et al. | 307/270 |

Primary Examiner—Edward P. Westin
Assistant Examiner—Jon Santamauro
Attorney, Agent, or Firm—Ross, Howison, Clapp & Korn

[57] ABSTRACT

A three-state input circuit operable to sense three separate logic states on an input pad (10) is operable to sense whether the current is sourced to the pad from a positive source or sinked from the pad to a negative source to provide two logic states. A third logic state is provided when it is determined that current is not being sourced to or sinked from the pad (10). A current source (36) is connected from a positive rail (14) through the source/drain path of an N-channel transistor (40) to the pad (10). This provides a sink current comparator function. A source current comparator function is provided by a current source (42) that is connected to the pad (10) through the source/drain path of a P-channel transistor (46) and to a negative voltage rail (18). The transistor (40) has a first bias voltage $V_{B1}$ connected to the gate thereof and the transistor (46) has a second bias voltage $V_{B2}$ connected to the gate thereof. When the pad (10) is connected to the negative rail (18) to sink current from the pad (10), current is conducted through the source/drain path of transistor (40). This is sensed by a decision logic circuit (32) to determine the first logic state. When current is sourced to the pad (10) from the positive rail (14), the transistor (46) turns on and current is passed through the current source (42) to represent a second logic state. When current is not sourced to or sinked from the pad (10) from an external positive or negative voltage source, both transistor (40) and transistor (46) are off, representing a third logic state.

22 Claims, 2 Drawing Sheets

THREE STATE INPUT CIRCUIT FOR AN INTEGRATED CIRCUIT

TECHNICAL FIELD OF THE INVENTION

The present invention pertains in general to three-state circuits, and more particularly, to a three-state input circuit for use as an input pad on an integrated circuit having a low impedance associated therewith.

BACKGROUND OF THE INVENTION

Three-state input circuits have typically dealt with relatively high impedance voltage input circuits. These input circuits typically utilize comparators and the such to sense hard voltage levels. These hard voltage levels are required to be present on the input to the three-state sense circuit in order to clearly define the voltage level, i.e., a high logic level, a low logic level and a mid-level logic level. These circuits typically do not tolerate a "floating" input. On integrated circuits, there are only a finite number of control pins. However, there is an ever increasing need to increase the number of functions associated with each pin. As such, such techniques as multiplexing, signal sharing, etc., have been utilized to expand the functionality of pins. For example, one pin can be designated as a test pin, which can have an operating mode and a test mode. In the test mode, all of the pins can be reassigned functions. However, one of the big disadvantages of present pin functionality is that they only accept two states, a "high" logic state or "low" logic state. It would be desirable to have an input pin that could be pulled high through a resistor to the positive voltage rail, pulled low through a resistor to the negative voltage rail, or allowed to "float". This would allow for three control signals to be associated with a given pin without requiring a finite voltage at the mid-level logic state. Present systems do not provide for this.

SUMMARY OF THE INVENTION

The present invention disclosed and claimed herein comprises a multiple state input buffer for sensing multiple logic state inputs to an input pad. The buffer is operable to be disposed between a positive supply rail and a negative supply rail. A first internal current source is provided for selectively sourcing current from the positive supply rail to the pad in response to a predetermined impedance being disposed between the pad and the negative rail. A second current source is provided for selectively sinking current from the pad to the negative supply rail in response to a predetermined impedance being disposed between the pad and the negative rail. A first current threshold device is operable to sense when current sourced from the first current source exceeds a first current threshold, this constituting a first logic input state. A second current threshold device is provided which is operable to sense when current sinked by the second current source exceeds a second current threshold, this constituting a second logic input state. A third logic state exists when current sinked from the pad is less than the first current threshold and current sourced to the pad is less than the first current threshold.

In another aspect of the present invention, the first and second current sources each source or sink current, respectively, when the respective first or second current threshold is exceeded on the input.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
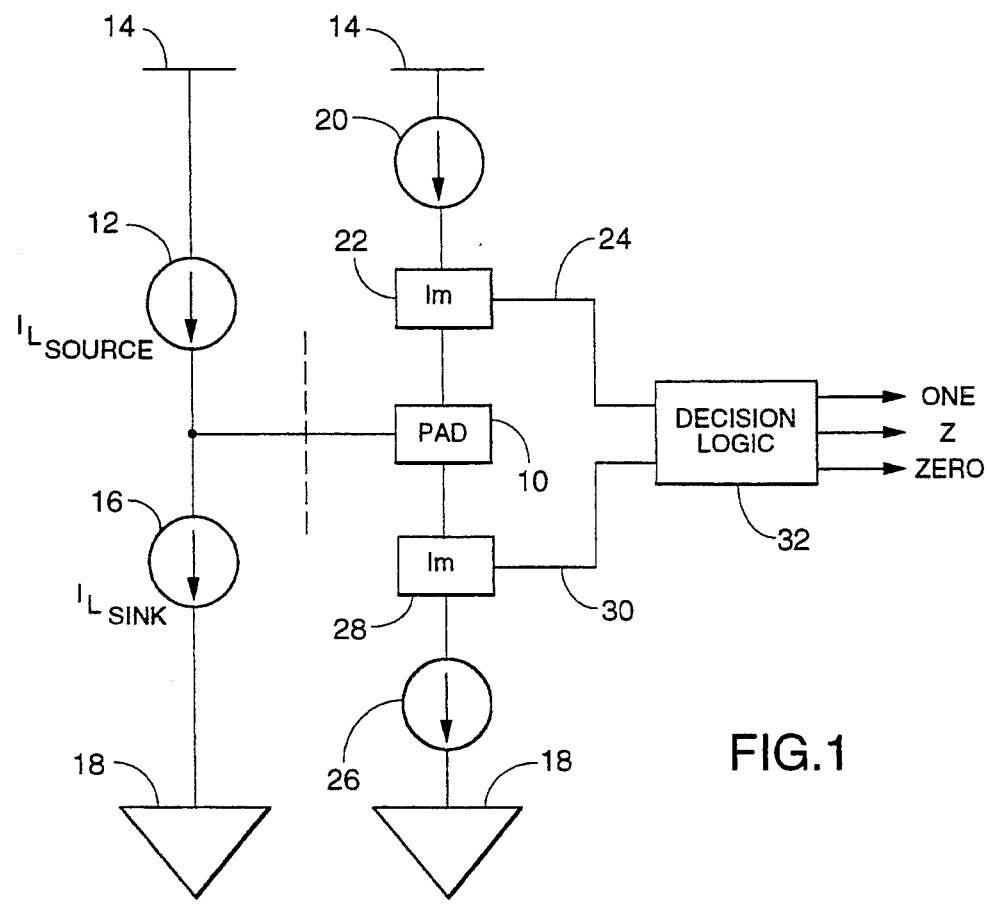
FIG. 1 illustrates a simplified schematic diagram of the three-state sense circuit of the present invention.

Referring now to FIG. 1, there is illustrated a schematic diagram of the three-state sense circuit of the present invention. An input pad 10 is provided which interfaces with an external signal. The external signal is provided in the form of two relatively low impedance current sources, a sourcing current source 12 connected between the pad and a positive rail 14 and a sinking current source 16 which is connected between the pad 10 and a negative rail 18. These current sources 12 and 16 are representative only and are in actuality voltage sources which provide either a low impedance path to the positive rail 14 or the negative rail 18. A dotted line illustrates the barrier between the exterior of the integrated circuit in which the input buffer circuit of the present invention is implemented. Interior to the integrated circuit, the pad 10 is operable to either have current sinked therefrom, sourced thereto, or placed in an open circuit or "floating" condition. A current source 20 is provided which is connected between the positive rail 14 and one input of a current threshold device 22. The other input to the current threshold device 22 is connected to the pad 10. When current is sinked from the pad 10 by the current source 16 and this current is in excess of the current supplied by the current source 20, the current threshold device 22 will signal this condition through a line 24. Similarly, a current Source 26 is connected on one side to the negative terminal 18 and the other side to the reference input of a current threshold device 28. The other input of the current threshold device 28 is connected to the pad 10. When current is sourced to the pad 10 and this current exceeds the level of the current reference provided by the current source 26, this is signaled by the current threshold device 28 on a line 30. The lines 24 and 30 are input to a decision logic circuit 32, which decision logic circuit 32 is operable to output a signal representing a logic "1" state whenever the current is sourced to the pad through the sourcing current source 12, a signal representing a logic "0" state whenever current is sinked from the pad 10 by the sinking current source 16 and a signal representing a logic "z" state whenever the current is neither sourced from nor sinked to the pad 10.

In operation, when an open circuit exists on the pad 10, current does not flow through the sink current threshold device 22 to the pad 10. However, when a low impedance is placed on the pad 10 to the positive rail 14 in the form of the sourcing current source 12 or, this provides a current path for the source current threshold device 28. When the current sourced to the pad 10 rises above a predetermined level, the current threshold provided by reference current source 26 is exceeded and the current threshold device 28 outputs a corresponding signal on line 30. Similarly, when a low impedance is placed between the pad 10 and the negative rail 18 in the form of a sinking current source 16, a current level above the current threshold provided by current reference source 20 is sensed by the current threshold device 22 and outputs a corresponding signal on line 24.

In an exemplary embodiment of the present invention, the pad 10 is disposed on an integrated circuit and operable to select one of three functions. A first function is achieved by tying the pad 10 through a resistor to a positive rail 14. A second function is achieved by connecting the pad 10 to the negative rail 18 through a resistor to provide a second logic state. Yet another function, a third function, is provided by leaving the pad open circuited. This in effect allows the designer the versatility of having three logic states selectable with a single pin and, therefore, three separate functions for a given pin that operates as a control pin. This control pin, therefore, constitutes a low impedance input pin, which operates on current thresholds.

Figure 2:
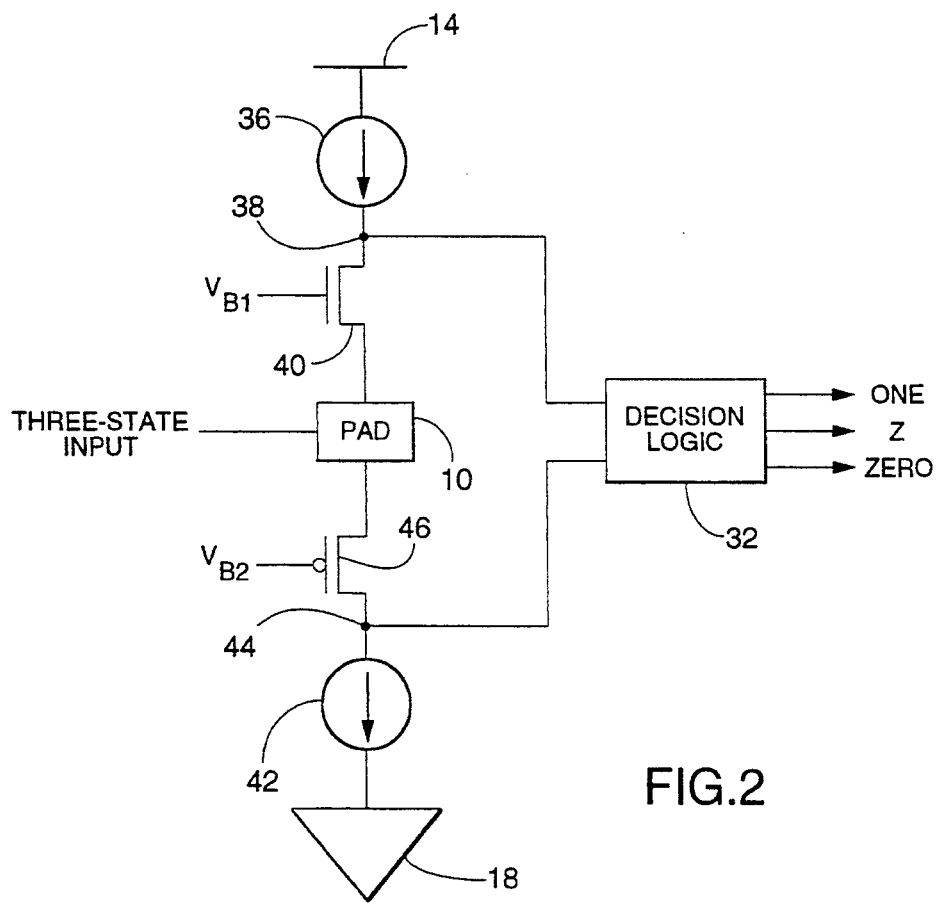
FIG. 2 illustrates a more detailed schematic diagram of the three-state sense circuit of the present invention.

Referring now to FIG. 2, there is illustrated a more detailed schematic diagram of the three-state input logic circuit of the present invention. A current source 36 is connected between the positive rail 14 and a node 38 with the source/drain path of an N-channel transistor connected between the node 38 and the pad 10. A bias voltage $V_{B1}$ is connected to the gate of the N-channel transistor 40. Similarly, a current source 42 is connected between a node 44 and the negative rail 18 with the source/drain path of a P-channel transistor connected between the node 44 and the pad 10. The gate of the P-channel transistor 46 is connected to a bias voltage $V_{B2}$. The node 38 is connected to the input of the decision logic circuit 32 and, similarly, the node 44 is connected to the input of the decision logic circuit 32.

In operation, the bias voltage on transistor 40 will allow current to flow through the source/drain path thereof whenever the voltage on the pad 10 is one threshold voltage $(V_T)$ below the bias voltage $V_{B1}$. Similarly, the current will only flow through the transistor 46 whenever the pad voltage is one $V_T$ above the voltage $V_{B2}$. Therefore, there is a range of voltages on the pad 10 that will result in no current flow through either of the transistors 40 or 46. In this condition, the current source 36 pulls the node 38 high and the current source 42 pulls the node 44 low. However, once the current threshold of either of the transistors 40 or 46 is exceeded, current rises abruptly to the level of the respective current source 36 or 42. This rising current is detected by the decision logic circuit 32 to output the respective logic "1" or the logic "0".

Figure 3:
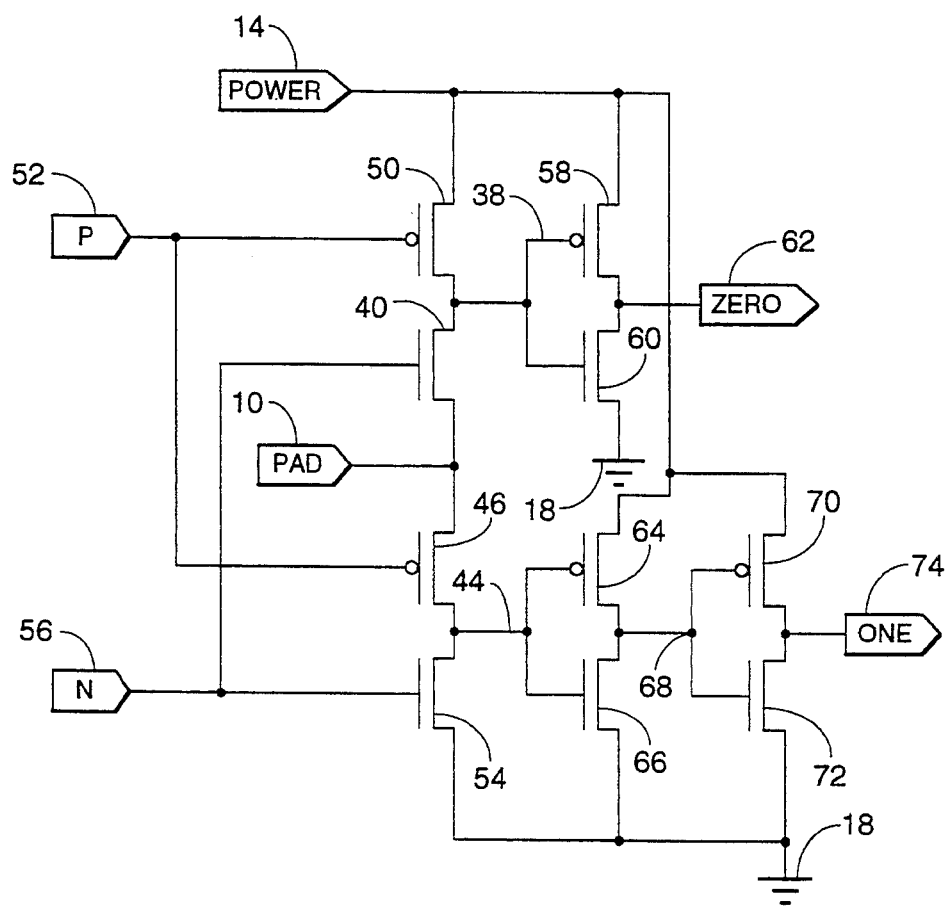
FIG. 3 illustrates a detailed schematic of the three-state sense circuit of the present invention.

Referring now to FIG. 3, there is illustrated a detailed schematic diagram of the current sources 36 and 42 and the transistors 40 and 46. The current source 36 is realized with a P-channel transistor 50, which has the source/drain path thereof connected between the positive terminal 14 and the node 38. The gate of the P-channel transistor 50 is connected to a bias pin 52. The current source 42 is realized with an N-channel transistor 54, the source/drain path thereof connected between the node 44 and the negative rail 18. The gate thereof is connected to a bias voltage pin 56.

The gate of the N-channel transistor 40 that is connected to the bias voltage $V_{B1}$ in FIG. 2 is connected to the bias voltage pin 56. Similarly, the gate of the P-channel transistor 46 is connected to the bias voltage pin 52, which comprises the bias voltage $V_{B2}$ as illustrated in FIG. 2.

The node 38 is connected to the gate of a P-channel transistor 58 and also to the gate of an N-channel transistor 60. The source/drain paths of the transistors 58 and 60 are connected in series with the common source/drain point comprising an output pin 62 which represents the logic "0" state when it is pulled high. The opposite end of the source/drain path of the transistor 58 is connected to the positive terminal 14 and the opposite side of the source/drain path of transistor 60 is connected to the negative rail 18. Therefore, the transistors 58 and 60 comprise an inverter.

The node 44 is connected to the gate of a P-channel transistor 64 and the gate of an N-channel transistor 66, the source/drain paths thereof connected in series with the common connection point providing an output at a node 68. The other side of the source/drain path of transistor 64 is connected to the positive rail 14 and the other side of the source/drain path of transistor 66 is connected to the negative rail 18. The common point 68 is connected to the gate of the P-channel transistor 70 and to the gate of an N-channel transistor 72, the source/drain paths thereof connected in series with a common point connected to an output pin 74, which output pin 74 comprises the logic "1" state when it is pulled high. The other side of the source/drain path of transistor 70 is connected to the positive rail 14 and the other side of the source/drain path of the transistor 72 is connected to the negative rail 18. The transistors 64 and 66 comprise a first inverter and the transistors 70 and 72 comprise a second inverter.

In operation, whenever the node 38 is pulled low due to current being sinked from the pad 10, transistor 58 is turned on and transistor 60 is turned off, thus pulling the pin 62 high, this representing a logic "0" state. Similarly, whenever current is sourced to the pad 10, node 44 will be pulled high, turning transistor 66 on and transistor 64 off. This will, in turn, turn transistor 70 on and transistor 72 off, pulling the pin 74 high, this representing a logic "1" state. Whenever current is neither sinked from or sourced to the pad 10, both pin 62 and pin 74 will be pulled low, representing a logic "z" state.

Figure 4:
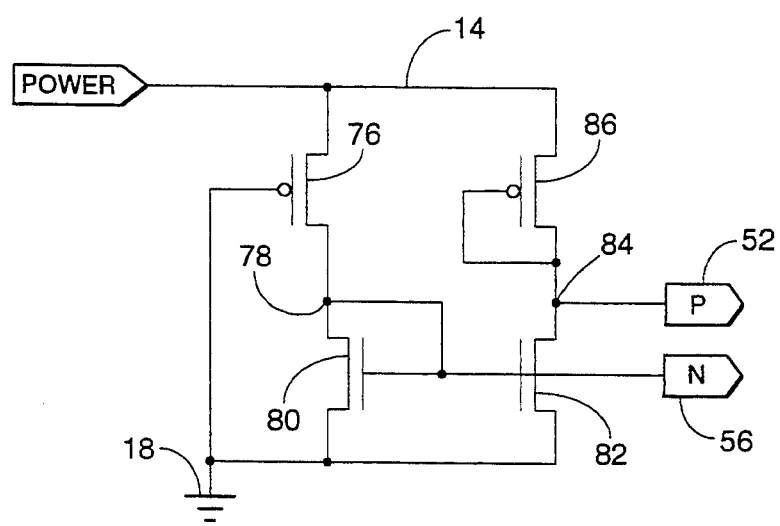
FIG. 4 illustrates a detailed schematic diagram of the bias circuit for the P-channel transistors and N-channel transistors utilized in the three-state sense circuit of the present invention.

Referring now to FIG. 4, there is illustrated a schematic diagram of the circuitry for developing the bias voltages for input to the pins 52 and 56. A P-channel transistor 76 has the source/drain path thereof connected to the positive rail 14 and a node 78. The gate of transistor 76 is connected to a negative rail 18, thus rendering it conductive. The node 78 is connected to one side of the source/drain path of an N-channel transistor 80, the other side thereof connected to the negative rail 18. The node 78 is connected to the gate of transistor 80, transistor 76 and transistor 80 therefore acting as a current source. The gate of transistor 80 is connected to the gate of an N-channel transistor 82 and also to the bias voltage pin 56. Therefore, the voltage on the bias voltage pin 56 will be substantially the same voltage that is on the node 78. The source/drain path of transistor 82 is connected between a node 84 and the negative rail 18, the node 84 connected to the bias voltage pin 52. A P-channel transistor 86 has the source/drain path thereof connected to the positive rail 14 and the node 84, the gate thereof connected to the node 84. Transistor 86 will therefore conduct whenever the voltage of node 84 is one $V_T$ below the voltage on the positive rail 14.

In summary, there has been provided a three-state input sense circuit for receiving on the input thereof a first logic state represented by an impedance that sources current to an input pin from a positive voltage, a second logic state represented by an impedance that sinks current from the input pin and a third logic state represented by a mid-voltage level or an open circuit that results in substantially no sourcing or sinking of current to the input pin. A decision logic circuit determines whether current is being sourced to the input pin or sinked from the input pin to determine one of two first and second logic states, respectively, and to determine the state where current is not being sinked or sourced from the pin, this being a third logic state.

Although the preferred embodiment has been described in detail, it should be understood that various changes, substitutions and alterations can be made therein without departing from the spirit and scope of the invention as defined by the appended claims.

What is claimed is:

1. A multiple state input buffer for sensing multiple logic state inputs to an input pad, comprising:
    a positive supply rail;
    a negative supply rail;
    a first current source for providing a source of current to the input pad such that current can be sinked from the input pad to an external current sink;
    a second current source for providing a sink for current from the input pad received from an external current source, such that current can be sourced to the input pad;
    a first current threshold device for sensing when current sinked from the input pad to the external current sink exceeds a first current threshold, this condition constituting a first logic input state;
    a second current threshold device for sensing when current sourced to the input pad from the external current source exceeds a second current threshold, this condition constituting a second logic input state; and
    a third logic slate existing when the current sinked from the input pad to the external current sink is less than said first current threshold and the current sourced to the input pad from the external current source is less than said second current threshold.

2. The input buffer of claim 1, wherein said third logic state exists when substantially no current is sinked from or sourced to the input pad.

3. The input buffer of claim 1, wherein the input pad has a substantially low impedance associated therewith.

4. The input buffer of claim 1, wherein said first current threshold device comprises:
    an N-channel transistor having the source/drain path thereof connected between said first current source at a first node and the input pad, and the gate thereof connected to a predetermined bias voltage, such that said N-channel transistor conducts only when the impedance between the input pad and said negative rail biases said N-channel transistor into a conductive state;
    said first node operable to output a voltage which decreases in value when said N-channel transistor conducts.

5. The input buffer of claim 1, wherein said second current threshold device comprises:
    a P-channel transistor having the source/drain path thereof connected between said second current source at a second node and the input pad, and the gate thereof connected to a predetermined bias voltage such that said P-channel transistor conducts only when the impedance between the input pad and said positive rail biases said P-channel transistor into a conductive state;
    said second node operable to output a voltage which decreases in value when said P-channel transistor conducts.

6. The input buffer of claim 1, wherein said first current source comprises a first current reference and said first current threshold device comprises a current comparator for comparing the current sinked from the input pad to the external current sink to said first current reference and outputting a first logic state signal when the current sinked from the input pad exceeds said first current reference.

7. The input buffer of claim 1, wherein said second current source comprises a second current reference and said second current threshold device comprises a current comparator for comparing the current sourced to the input pad from the external current source to said second current reference and outputting a second logic state signal when the current sourced to the input pad exceeds said second current reference.

8. The input buffer of claim 1, wherein said first current source is operable to provide said source of current from said positive supply rail.

9. The input buffer of claim 1, wherein said second current source is operable to provide the sink for current from the input pad to said negative supply rail.

10. A multiple input buffer for sensing multiple logic state inputs to an input pad, comprising:
    means for sensing when current is sinked from the input pad to an external current sink and said sinked current exceeds a predetermined first current threshold, this constituting a first logic state;
    means for sensing when current is sourced to the input pad from an external current source and said sourced current exceeds a predetermined second current threshold, this constituting a second logic state;
    means for sensing when current sinked from the input pad to the external current sink is less than said first current threshold and current sourced to the input pad from the external current source is less than said second current threshold, this constituting a third logic state; and
    means for providing an output indicative of the first, second and third logic states.

11. The input buffer of claim 10, wherein said means for sensing when current is sinked from the input pad to the external current sink comprises:
    a current source for providing current to the input pad from a positive voltage source whenever current sinked from the input pad to the external current sink exceeds said first predetermined current threshold; and
    means for sensing when said current sourced to the input pad from the positive voltage source exceeds said first current threshold, this constituting the first logic state.

12. The input buffer of claim 10, wherein said means for sensing when current is sourced to the input pad from the external current source comprises:

a current sink for sinking current from the input pad to a negative voltage source whenever current sourced to the input pad from the external current source exceeds said second predetermined current threshold; and means for sensing when said current sinked from the input pad to the negative voltage source by said current sink exceeds said second current threshold, this constituting the second logic state.

13. The input buffer of claim 10, wherein said means for sensing when current is sinked from the input pad to an external current sink comprises:

a current reference: and a current comparator for comparing the current flow between the input pad and said external current sink and said external current source to said current reference and outputting a signal indicative of said first logic state when current sinked from the input pad to said external current sink exceeds said current reference, said signal indicative of said first logic state output to said means for providing an output.

14. The input buffer of claim 10, wherein said means for sensing when current is sourced to the input pad from an external current source comprises:

a current reference;

a current comparator for comparing the current flow between the input pad and said external current sink and said external current source to said current reference and outputting a signal indicative of said second logic state when current sourced to the input pad from said external current source exceeds said current reference, said signal indicative of said second logic state output to said means for providing an output.

15. A method for sensing multiple logic states input to an input pad comprising steps of:

providing a source of current to the input pad;

providing a sink for current from the input pad;

sensing when current sinked from the input pad to an external current sink exceeds a first current threshold, this condition constituting a first logic state;

sensing when current sourced to the input pad from an external current source exceeds a second current threshold, this condition constituting a second logic input state; and sensing when current sourced to the input pad from the external current source is less than the second current threshold and when the current sinked from the input pad to the external current sink is less than the first current threshold, this condition constituting a third logic state.

16. The method of claim 15, wherein the step of sensing when the current sinked from the input pad to the external current sink is less than the first current threshold and the current sourced to the input pad from the external current source is less than a second current threshold comprises sensing when substantially no current is sinked from or sourced to the input pad from external thereto.

17. The method of claim 16, wherein the input pad has a substantially low impedance associated therewith.

18. The method of claim 15, wherein the step of providing a source of current to the input pad comprises:

disposing a current source between a positive supply rail and a first node; and disposing a source/drain path of an N-channel transistor between the first node and the input pad with the gate thereof connected to a predetermined bias voltage such that the N-channel transistor conducts only when the impedance between the input pad and a negative supply rail biases the N-channel transistor into a conductive state;

the step of sensing when current is sinked from the input pad to the external current sink exceeds the first current threshold comprises sensing when the voltage on the first node decreases below a predetermined value when the N-channel transistor conducts.

19. The method of claim 15, wherein the step of providing a sink for current from the input pad comprises:

disposing a current source between a negative supply rail and a first node; and disposing the source/drain channel of a P-channel transistor between the first node and the input pad with the gate thereof connected to a predetermined bias voltage such that the P-channel transistor conducts only when the impedance between the input pad and a positive supply rail biases the P-channel transistor into a conductive state;

the step of sensing when current sourced to the input pad from the external current source exceeds the second current threshold comprises sensing when the voltage on the first node decreases in value below a predetermined voltage threshold when the P-channel transistor conducts.

20. A method for sensing multiple logic state inputs to an input pad, comprising steps of:

sensing when current is sinked from the input pad to an external current sink and when the sinked current exceeds a predetermined first current threshold, this constituting a first logic state;

sensing when current is sourced to the input pad from an external current source and the sourced current exceeds a predetermined second current threshold, this constituting a second logic state;

sensing when current sinked from the input pad to the external current sink is less than the first current threshold and current sourced to the input pad from the external current source is less than the second current threshold, this constituting a third logic state; and providing an output indicative of the first, second and third logic states.

21. The method of claim 20, wherein the step of sensing when current is sinked from the input pad to the external current sink comprises:

sourcing current to the input pad from a current source that sources current from a positive voltage source whenever current sinked from the input pad to the external current sink exceeds the first predetermined current threshold; and sensing when the current sourced to the input pad from the positive voltage source exceeds the first current threshold, this constituting the first logic state.

22. The method of claim 20, wherein the step of sensing when current is sourced to the input pad comprises:

sinking current from the input pad to a negative voltage source whenever current sourced to the input pad from the external current source exceeds the second current threshold; and sensing when the current sourced to the input pad from the external current source exceeds the second current threshold, this constituting the second logic state.

* * * * *

UNITED STATES PATENT AND TRADEMARK OFFICE
CERTIFICATE OF CORRECTION

PATENT NO. : 5,373,202

DATED : December 13, 1994

INVENTOR(S) : Gene Lee Armstrong, II

It is certified that error appears in the above-identified patent and that said Letters Patent is hereby corrected as shown below:

Column 2, line 46, replace "Source" with --source--.

Column 2, line 66, delete "or".

In the Claims:

Column 7, Claim 13, line 13, replace ":" with --;--.

Signed and Sealed this

Twenty-fifth Day of April, 1995

*Attest:*

BRUCE LEHMAN

*Attesting Officer*     *Commissioner of Patents and Trademarks*